(12) United States Patent
Zuo et al.

(10) Patent No.: US 9,368,565 B2
(45) Date of Patent: Jun. 14, 2016

(54) METAL FILM RESISTOR STRUCTURE AND MANUFACTURING METHOD

(75) Inventors: Qingyun Zuo, Pudong (CN); Xiaoxu Kang, Pudong (CN); Shaohai Zeng, Pudong (CN)

(73) Assignee: SHANGHAI IC R & D CENTER CO., LTD., Shanghai (CN)

( * ) Notice: Subject to any disclaimer, the term of this patent is extended or adjusted under 35 U.S.C. 154(b) by 0 days.

(21) Appl. No.: 13/884,970

(22) PCT Filed: Feb. 7, 2012

(86) PCT No.: PCT/CN2012/070938
§ 371 (c)(1),
(2), (4) Date: Aug. 22, 2013

(87) PCT Pub. No.: WO2013/056523
PCT Pub. Date: Apr. 25, 2013

(65) Prior Publication Data
US 2014/0217550 A1    Aug. 7, 2014

(30) Foreign Application Priority Data
Oct. 20, 2011    (CN) .......................... 2011 1 0321426

(51) Int. Cl.
*H01L 21/33*    (2006.01)
*H01L 21/00*    (2006.01)
(Continued)

(52) U.S. Cl.
CPC ............ *H01L 28/20* (2013.01); *H01L 23/5228* (2013.01); *H01L 23/53238* (2013.01); *H01L 28/24* (2013.01); *H01L 2924/0002* (2013.01)

(58) Field of Classification Search
CPC .......... H01L 21/01; H01L 27/00; H01L 21/00
USPC ......... 257/536, 638–640, 739, 753, 773–774, 257/E21.304, E21.259, E21.495; 438/381–384, 626, 706, 629
See application file for complete search history.

(56) References Cited

U.S. PATENT DOCUMENTS 6,734,076 B1 *   5/2004   Jaiswal et al. ................ 438/384
6,943,451 B2 *   9/2005   Whitehair et al. ............ 257/774
(Continued)

FOREIGN PATENT DOCUMENTS

KR   1020060039607 A  *  5/2005
KR   1020050079552 A  *  8/2005

OTHER PUBLICATIONS

English translation of KR1020050079552 A.*
(Continued)

*Primary Examiner* — Jessica Stultz
*Assistant Examiner* — Sheikh Maruf
(74) *Attorney, Agent, or Firm* — Anova Law Group, PLLC

(57) ABSTRACT

A method is provided for manufacturing a semiconductor device with a metal film resistor structure. The method includes providing an insulation layer on the semiconductor device. A lower copper interconnect is formed in the insulation layer. The method also includes forming a cap layer on the insulation layer and the lower copper interconnect and etching the cap layer based on a single photolithography mask to form a window exposing portion of the lower copper interconnect and portion of the insulation layer. Further, the method includes forming a metal film layer on the cap layer and inside the window such that exposed portion of the lower copper interconnect is connected with part of the metal film layer within the window. The method also includes performing a chemical mechanical polishing (CMP) process to form a metal film resistor based on the metal film layer. The metal film resistor is connected with the portion of the lower copper interconnect.

11 Claims, 13 Drawing Sheets

(51) Int. Cl.
  *H01L 49/02* (2006.01)
  *H01L 23/522* (2006.01)
  *H01L 23/532* (2006.01)

(56) References Cited

U.S. PATENT DOCUMENTS

| | | | |
|---|---|---|---|
| 7,291,525 B1* | 11/2007 | Hill | 438/190 |
| 2001/0049199 A1* | 12/2001 | Steinmann et al. | 438/697 |
| 2002/0197844 A1* | 12/2002 | Johnson et al. | 438/618 |
| 2004/0245575 A1* | 12/2004 | Beach et al. | 257/359 |
| 2005/0258513 A1* | 11/2005 | Eshun | 257/536 |
| 2006/0226555 A1* | 10/2006 | Noguchi et al. | 257/774 |
| 2008/0012147 A1* | 1/2008 | Watanabe | 257/774 |
| 2009/0176367 A1* | 7/2009 | Baks et al. | 438/654 |
| 2010/0025852 A1* | 2/2010 | Ueki et al. | 257/761 |
| 2010/0308463 A1* | 12/2010 | Yu et al. | 257/753 |
| 2011/0012184 A1* | 1/2011 | Yuki | 257/306 |
| 2011/0024834 A1* | 2/2011 | Hull et al. | 257/335 |
| 2011/0217824 A1* | 9/2011 | Ohuchi | 438/382 |
| 2012/0104350 A1* | 5/2012 | Himeno | H01L 45/08 257/4 |
| 2012/0199805 A1* | 8/2012 | Sorada | H01L 27/101 257/2 |
| 2012/0199942 A1* | 8/2012 | Kageyama | H01L 23/5258 257/529 |
| 2012/0280200 A1* | 11/2012 | Tada | H01L 45/04 257/4 |
| 2013/0009123 A1* | 1/2013 | Tada | C23C 16/0272 257/3 |
| 2013/0082231 A1* | 4/2013 | Tada | G11C 13/0007 257/4 |
| 2013/0126953 A1* | 5/2013 | Wang | H01L 29/94 257/295 |
| 2013/0224931 A1* | 8/2013 | Sorada | H01L 27/101 438/382 |
| 2013/0240971 A1* | 9/2013 | Takekida | H01L 27/0738 257/316 |
| 2014/0191367 A1* | 7/2014 | Xiao | H01L 28/20 257/537 |

OTHER PUBLICATIONS

English translation of KR1020060039607 A.*

* cited by examiner

METAL FILM RESISTOR STRUCTURE AND MANUFACTURING METHOD

CROSS-REFERENCE TO RELATED APPLICATION

This application claims the priority benefit of International Patent Application Serial No. PCT/CN2012/070,938, filed Feb. 7, 2012, which is related to and claims the priority benefit of China patent application serial no. 201110321426.3 filed Oct. 20, 2011. The entirety of each of the above-mentioned patent applications is hereby incorporated by reference herein and made a part of this specification.

FIELD OF THE INVENTION

The present invention generally relates to the field of semiconductor technologies and, more particularly, to metal film resistor structures and manufacturing methods.

BACKGROUND OF THE INVENTION

While the integrated circuitry (IC) is evolving according to the Moore's Law, requirements on devices and system performance are becoming higher and higher. It has become increasingly important to integrate both passive devices and active devices on a same chip. With the development of SOC and RF circuits, many design companies and chip manufacturers are focusing on passive devices with a high integration degree, high accuracy, and high reliability, such as resistors.

Resistors integrated on a chip generally include buried layer resistors, well resistors, polysilicon resistors, and metal film resistors, etc. Among them, metal film resistors can be integrated in a backend of line process, without increasing the chip area, and, thus, their cost can be reduced. In addition, the temperature coefficient of resistance (TCR) of metal film resistors is small, so the influence of temperature on the resistance is small. Thus, the metal film resistors can provide resistance for circuits with high stability in an environment of different temperatures. In conventional technologies, metal film resistors can generally be manufactured using two-additional-lithography-mask techniques or one-additional-lithography-mask techniques.

FIG. 1 shows a metal film resistor made using two additional lithography masks according to the conventional techniques. As shown in FIG. 1, main process steps for making the metal film resistor structure 10 include: providing insulation layer 100 and forming lower copper interconnect 110 in insulation layer 100; forming diffusion barrier layer 120 above the lower copper interconnect 110 and the insulation layer 100 to protect against and block the copper diffusion of the lower copper interconnect 110; etching diffusion barrier layer 120 via photolithography using a first lithography mask to expose part of lower copper interconnect 110 without exposing the insulation layer 100; forming a metal film layer on the diffusion barrier layer 120 and the exposed copper interconnect 110; and etching the metal film layer via photolithography using a second lithography mask to form metal film resistor 130. Although this structure can control size and pattern of the metal film resistor, two additional lithography masks may be required and, thus, manufacturing cost may be greatly increased.

FIG. 2 shows a metal film resistor using one additional lithography mask according to the conventional techniques. As shown in FIG. 2, main process steps for making the metal film resistor structure 20 include: providing insulation layer 200 and forming lower copper interconnect 210 in the insulation layer 200; forming diffusion barrier layer 220 above the lower copper interconnect 210 and the insulation layer 200 to protect against and block the copper diffusion in the lower copper interconnect 210; forming a metal film layer on the diffusion barrier layer 220 without exposing either insulation layer 200 or lower copper interconnect 210; and etching the metal film layer via photolithography using a lithography mask to form metal film resistor 230. Of course, follow-up processes can also include forming an inter-metal dielectric layer (IMD) 240 and an upper copper interconnect 250 in the inter-metal dielectric layer 240, where the upper copper interconnect 250 and metal film resistor 230 are connected.

The second option only requires one additional lithography mask to integrate metal film resistor 230 into subsequent or back-end manufacturing processes, which may greatly reduce manufacturing cost. However, because the electrical connection of the metal film resistor 230 is through the upper copper interconnect 250, when etching the vias in the upper copper interconnect 250, over etching can damage the metal film resistor 230 or even completely etch away the metal film resistor 230 at the connection joint. Thus, the manufacturing process of the metal film resistor 230 may fluctuate substantially and may affect the performance of metal film resistor 230. Meanwhile, due to the etching issue, the metal film resistor 230 needs to maintain a substantial thickness. It is difficult to have very large square resistance value to satisfy the required large resistance (e.g., greater than 1000 Q/square) in certain analog and RF circuits. Thus, applications and development of such metal film resistors are limited.

The disclosed methods and systems are directed to solve one or more problems set forth above and other problems.

SUMMARY OF THE INVENTION

One aspect of the present disclosure includes a method for manufacturing a metal film resistor structure on a semiconductor device. The method includes providing an insulation layer on the semiconductor device. A lower copper interconnect is formed in the insulation layer. The method also includes forming a cap layer on the insulation layer and the lower copper interconnect and etching the cap layer based on a single photolithography mask to form a window exposing portion of the lower copper interconnect and portion of the insulation layer. Further, the method includes forming a metal film layer on the cap layer and inside the window such that exposed portion of the lower copper interconnect is connected with part of the metal film layer within the window. The method also includes performing a chemical mechanical polishing (CMP) process to form a metal film resistor based on the metal film layer. The metal film resistor is connected with the portion of the lower copper interconnect.

Another aspect of the present disclosure includes a metal film resistor structure on a semiconductor device. The semiconductor device includes an insulation layer formed on the semiconductor device and containing a lower copper interconnect, and a cap layer formed on the insulation layer and the lower copper interconnect. The semiconductor device also includes a window formed by etching the cap layer based on a single photolithography mask and exposing portion of the lower copper interconnect and portion of the insulation layer. Further, the semiconductor device includes a metal film resistor formed inside the window by performing a chemical mechanical polishing (CMP) process on a metal film layer, which is formed on the cap layer and inside the window, such that the metal film resistor is connected with the exposed portion of the lower copper interconnect.

Another aspect of the present disclosure includes a method for manufacturing a metal film resistor structure on a semiconductor device. The method includes providing an insulation layer on the semiconductor device. A lower copper interconnect is formed in the insulation layer with portion of the lower copper connect exposed at a top surface of the insulation layer. The method also includes forming a metal film layer on the insulation layer and the lower copper interconnect and etching the metal film layer based on a photolithography mask to form a metal film resistor on the insulation layer and the lower copper interconnect. The metal film resistor covers entire exposed portion of the lower copper interconnect and are connected with the part of the exposed portion of the lower copper interconnect.

Other aspects of the present disclosure can be understood by those skilled in the art in light of the description, the claims, and the drawings of the present disclosure.

DETAILED DESCRIPTION OF THE EMBODIMENTS

Reference will now be made in detail to exemplary embodiments of the invention, which are illustrated in the accompanying drawings. Wherever possible, the same reference numbers may be used throughout the drawings to refer to the same or like parts.

Figure 8:
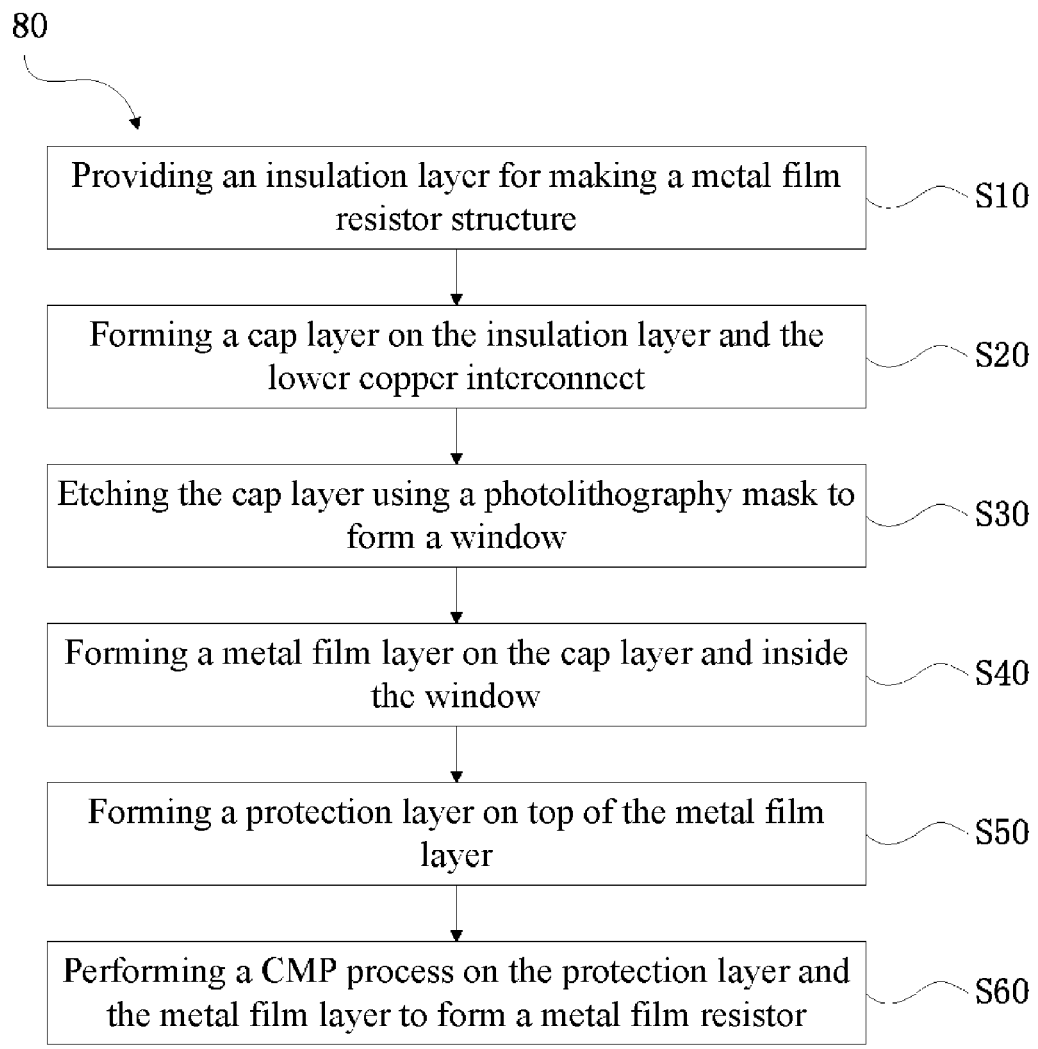
FIG. 8 illustrates an exemplary metal film resistor structure manufacturing process consistent with the disclosed embodiments.

FIG. 8 illustrates an exemplary metal film resistor manufacturing process 80, and FIGS. 3A-3F illustrate cross-section views of an exemplary metal film resistor structure 30 corresponding to various stages of the manufacturing process 80.

As shown in FIG. 8, at the beginning of the metal film resistor manufacturing process 80, an insulation layer is provided for making a metal film resistor structure (S10). The metal film resistor manufacturing process 80 may be applied during a later stage of a manufacturing process of a semiconductor device or during a back-end process of the semiconductor device.

Figure 1:
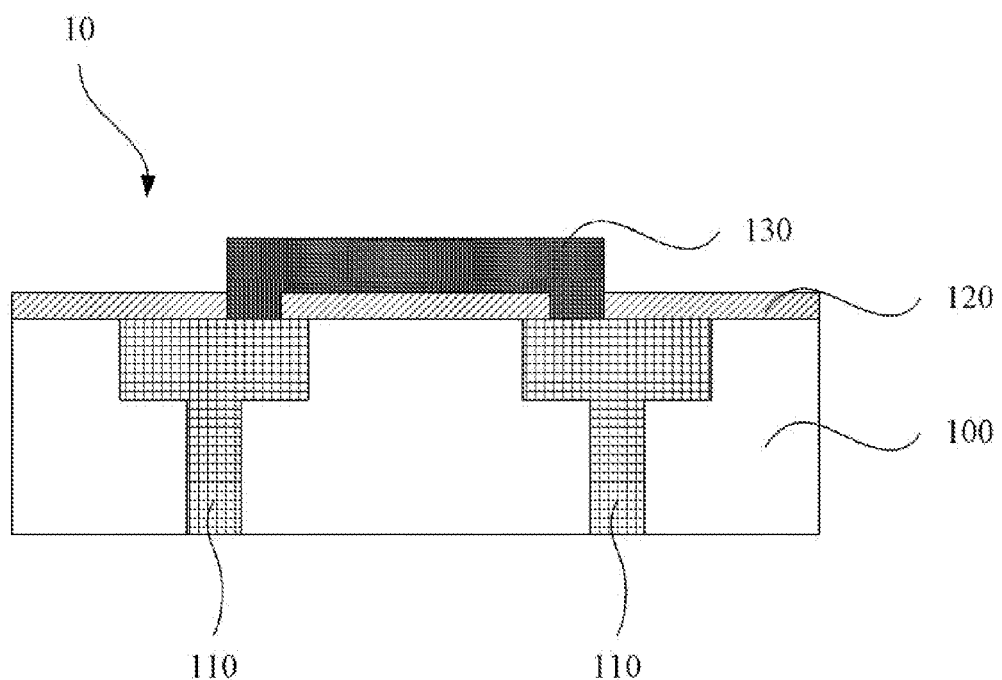
FIG. 1 shows a conventional metal film resistor structure.
Figure 2:
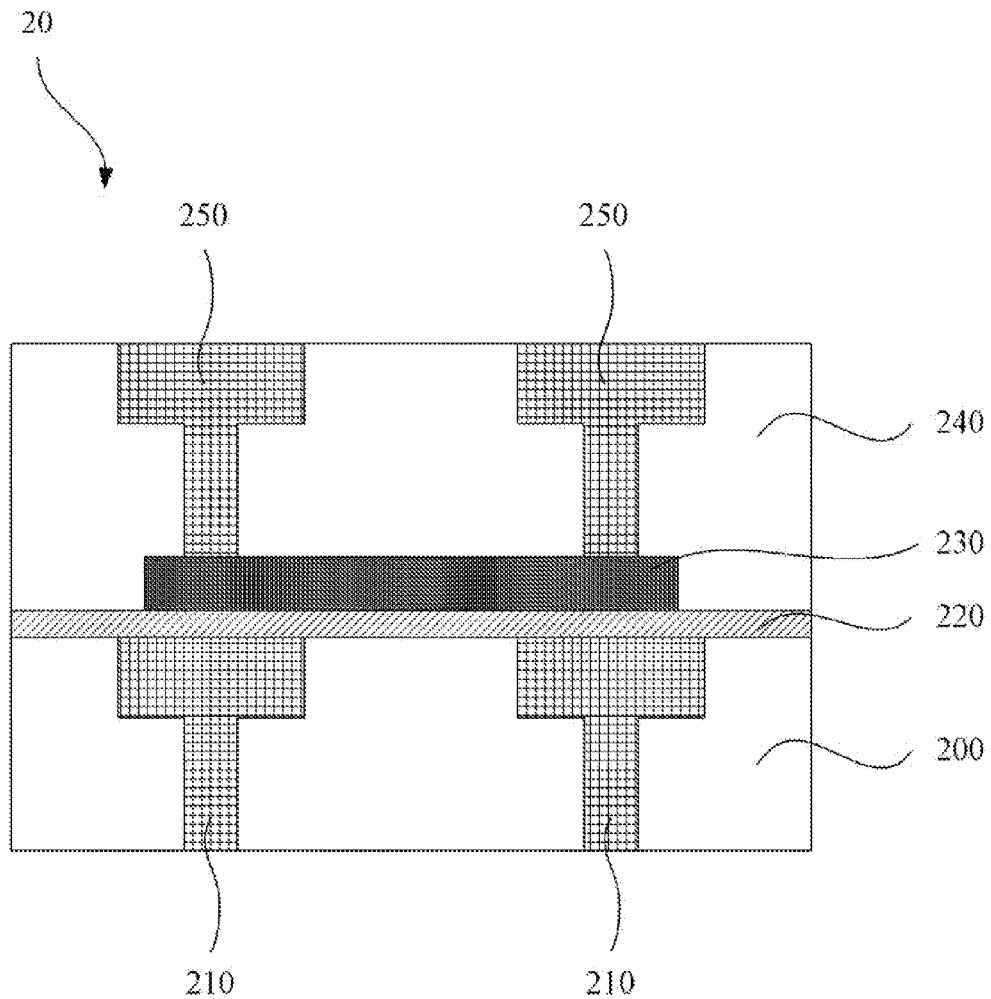
FIG. 2 shows another conventional metal film resistor structure.
Figure 3A:
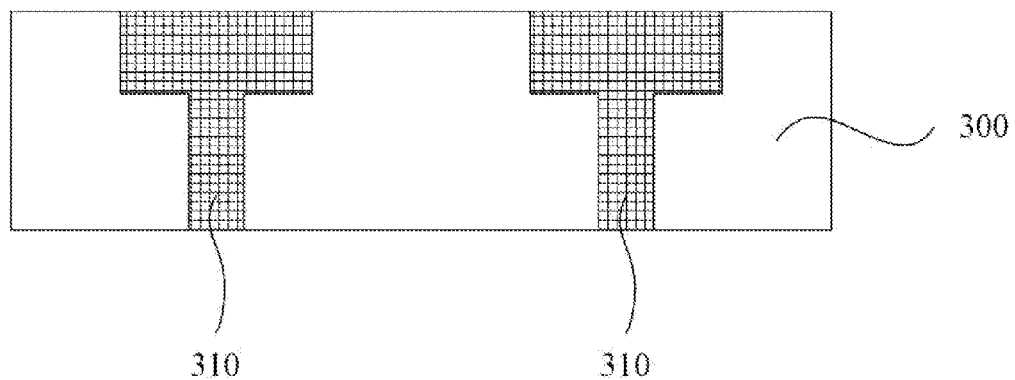
FIGS. 3A-3F illustrate manufacturing stages of an exemplary metal film resistor structure consistent with the disclosed embodiments.

Correspondingly, FIG. 3A shows that, during the manufacturing process, an insulation layer 300 is provided on top of a semiconductor device (not shown) which is being manufactured in order to form metal film resistor structure 30. For example, insulation layer 300 may be formed or provided on top of a substrate (not shown).

The substrate may include any appropriate material for manufacturing CMOS and other semiconductor devices. For example, the substrate may include silicon, silicon dioxide, aluminum oxide, sapphire, germanium, gallium arsenide (GaAs), an alloy of silicon and germanium, or indium phosphide (InP), etc. Other materials or combinations may also be used. Further, the substrate may contain other circuit structures already fabricated, interconnected, and/or ready for integration of passive devices such as metal film resistors, etc.

Insulation layer 300 may be formed using any appropriate material, such as SiO2, FSG (fluorine-doped silica, SiOF), or other low K-dielectric material, and lower copper interconnect 310 may be formed in insulation layer 300. Lower layer copper interconnect 310 may include any appropriate copper interconnect (e.g., trenches, vias) arranged in one or more layers.

Figure 3B:
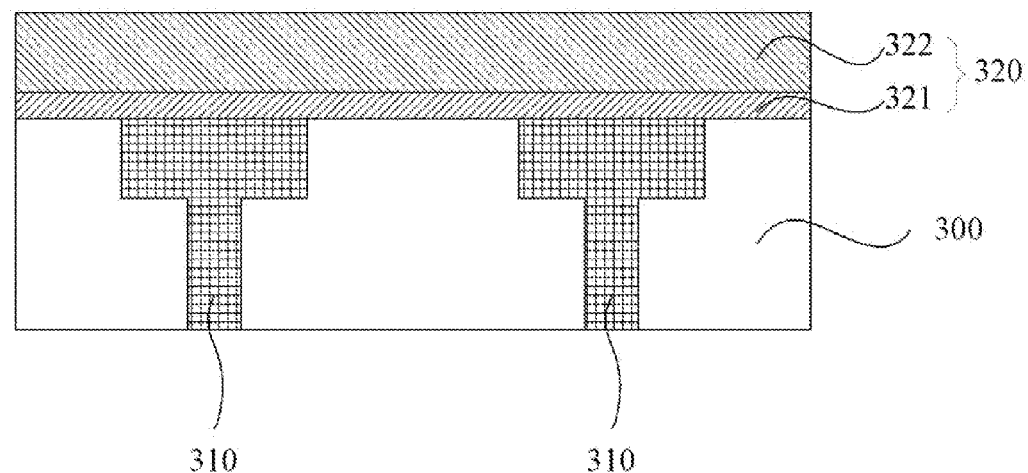

Returning to FIG. 8, after providing the insulation layer 300 (S10), a cap layer is formed on the insulation layer and the lower copper interconnect (S20). FIG. 3B shows that cap layer 320 is formed on the insulation layer 300 and lower copper interconnect 310. Cap layer 320 may include certain structures. For example, cap layer 320 may include a diffusion barrier layer 321 and a reinforcement layer 322. Other layers may also be included.

The diffusion barrier layer 321 may be used to block copper diffusion of the lower copper interconnect 310. The diffusion barrier layer 321 may include any appropriate material, such as silicon nitride or silicon carbide, and may have a thickness of approximately 150 angstroms to 700 angstroms. Further, the reinforcement layer 322 may be used to increase the thickness of the cap layer 320. The reinforcement layer 322 may include any appropriate material, such as SiO2, FSG, or other low K-dielectric material, and may have a thickness of approximately 100 angstroms to 2000 angstroms. The reinforcement layer 322 may provide a substantially large process-window for subsequent processes, especially the subsequent chemical mechanical polishing processes.

Figure 3C:
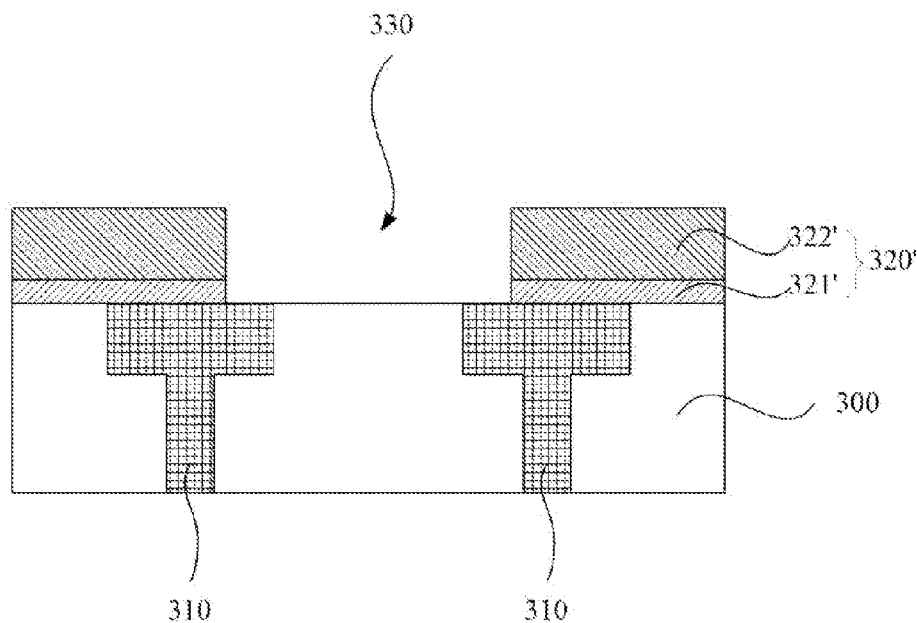

Returning to FIG. 8, after forming the cap layer (S20), the cap layer is etched using a photolithography mask to form a window (S30). FIG. 3C shows that window 330 is formed by etching cap layer 320 using a photolithography mask (not shown). That is, a photolithography process may be performed on cap layer 320, and an etching process (e.g., a dry etching process or a wet etching process) may be performed to etch away portion of the diffusion layer 321 and the reinforcement layer 322 based on the photolithography mask to form the window 330.

The photolithography mask may be selected such that window 330 may also expose part of the lower copper interconnect 310 and part of the insulation layer 300 within the window 330. More particularly, the window 330 may expose certain portion of top surfaces of the lower copper interconnect 310 and certain top surfaces of the insulation layer 300 surround or between the top surfaces of the lower copper interconnect 310. Further, window 330 may have a height as the total thickness of the diffusion barrier layer 321 and the reinforcement layer 322 and the height may be in a range of approximately 250 angstroms to 2700 angstroms. Other values may also be used.

Figure 3D:
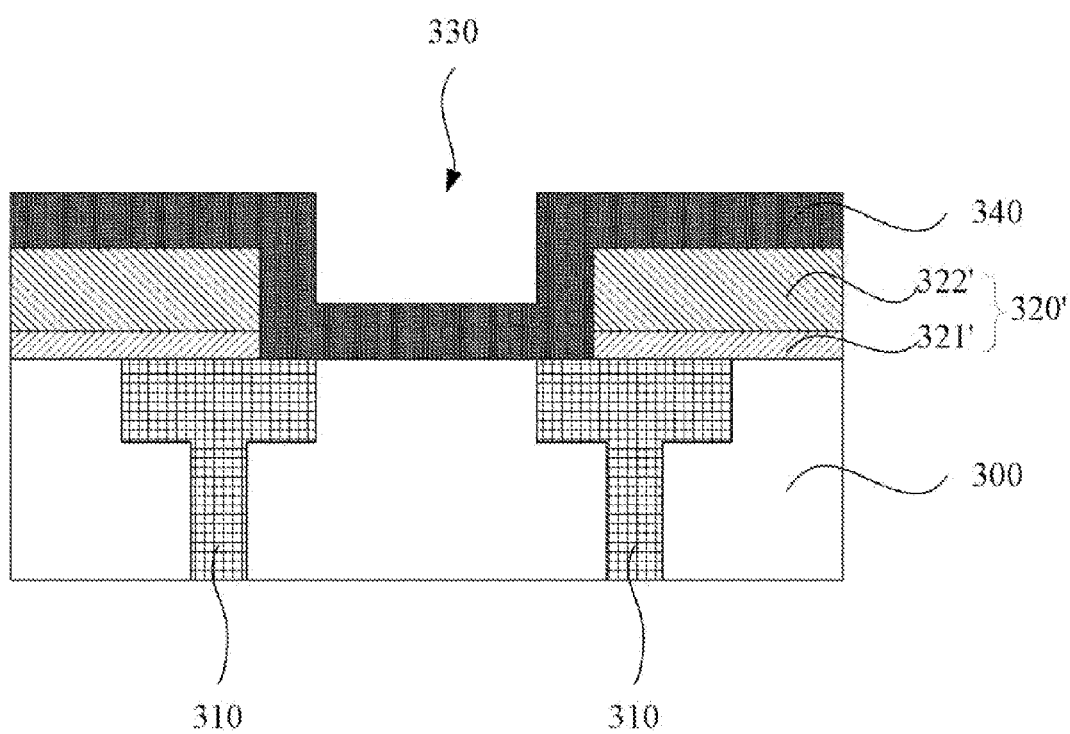

Returning to FIG. 8, after forming the window in the cap layer (S30), a metal film layer is formed on the cap layer and inside the window (S40). FIG. 3D shows that a metal film layer 340 is formed on top of the remaining cap layer 320 and inside the window 330. The metal film layer 340 may be formed using any appropriate deposition process, such as a physical vapor deposition process, a chemical vapor deposition process, or an atomic layer deposition process. The thickness of the metal film layer 340 may be less than the height of the window 330. For example, the metal film layer 340 may have a thickness of approximately 50 angstroms to 2000 angstroms and may include one or more of W, WNx, Ti, TiNx, Ta and TaNx. Other materials may also be included.

Figure 3E:
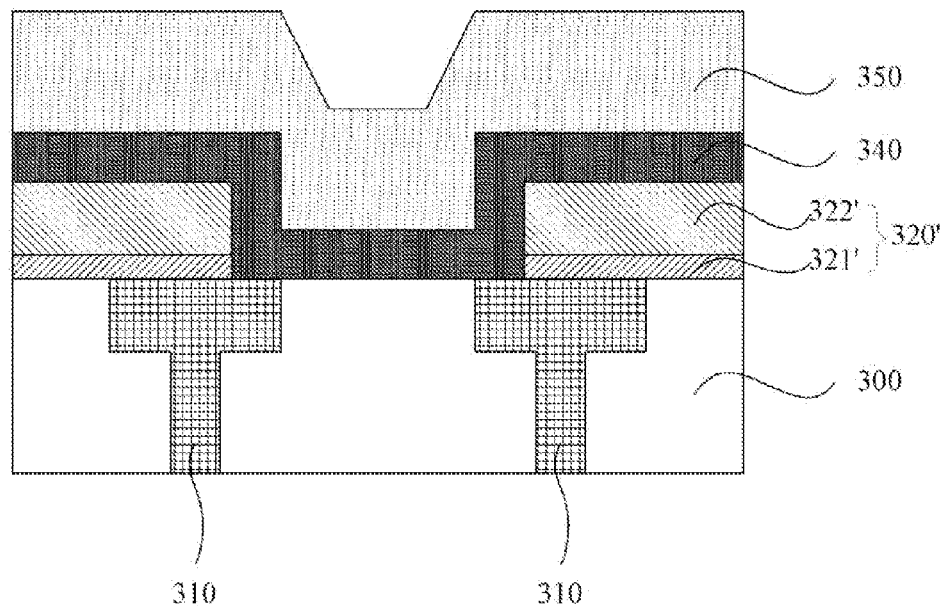

Returning to FIG. 8, after forming the metal film layer (S40), optionally or additionally, a protection layer is formed on top of the metal film layer (S50). FIG. 3E shows that a protection layer 350 is formed on the metal film layer 340. The protection layer 350 may include any appropriate material, such as SiO2, FSG, and other low K-dielectric material, and may have a thickness of approximately 1000 angstroms to 2000 angstroms. The protection layer 350 may be used to protect the subsequently formed metal film resistor through the follow-up chemical mechanical polishing (CMP) process.

Figure 3F:
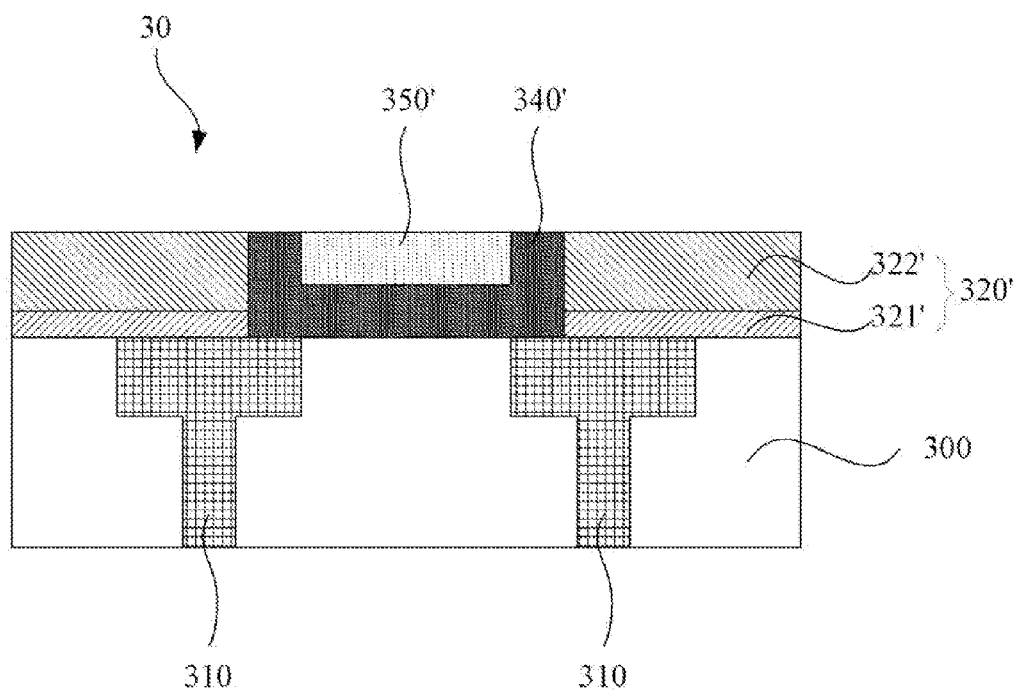

Further, as shown in FIG. 8, a CMP process is performed on the protection layer and the metal film layer to form a metal film resistor (S60). FIG. 3F shows that a CMP process has been performed on the protection layer 350 and metal film layer 340 to form metal film resistor 340'. The metal film resistor 340' is connected with the lower copper interconnect 310 on the top surface of lower copper interconnect 310 as exposed by window 330. Further, portion of the protection layer 350 may be kept to protect metal film resistor 340' during the chemical mechanical polishing process. The process reliability of the metal film resistor 340' may be substantially improved. Such configuration may be obtained by controlling the height of the window 330 and the thickness of metal film layer 340, etc.

Therefore, metal film resistor structure 30 is formed, including insulation layer 300, cap layer 320, metal film layer 340, and protection layer 350. The insulation layer 300 contains lower copper interconnect 310, and the cap layer 320 contains diffusion barrier layer 321 and reinforcement layer 322. The cap layer 320 also includes window 330 exposing part of the copper interconnect 310 and part of insulation layer 300, such that the metal film layer 340 formed on top of the insulation layer 300 and the lower copper interconnect 310 can be electrically connected to the lower copper interconnect 310. Further, metal film resistor 340' is formed within window 330. Thus, finally-formed metal film resistor 340' may then be integrated by connecting the lower copper interconnect 310 through a photolithography process using a single photolithography mask.

Figure 4A:
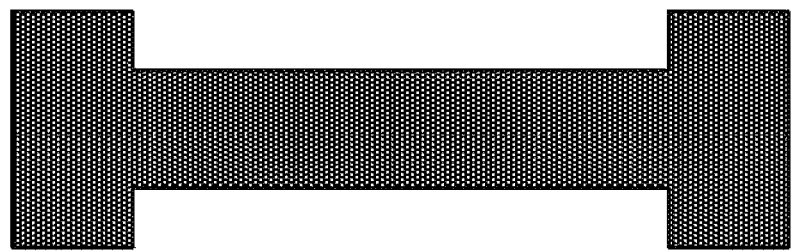
FIGS. 4A-4B illustrate top views of metal film resistors consistent with the disclosed embodiments.
Figure 4B:
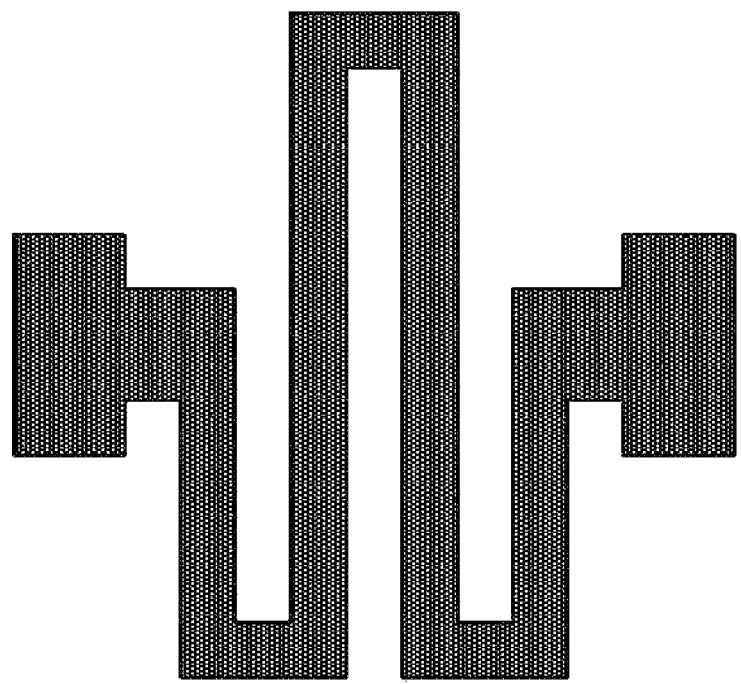

The metal film resistor 340' may be configured into various predetermined shapes or structures. FIGS. 4A-4B illustrates certain exemplary configurations of metal film resistor 340'.

As shown in FIG. 4A, metal film resistor 340' includes two ends and a straight middle part. FIG. 4B shows that metal film resistor 340' includes two ends and a middle part with a series of turns. Other configurations may also be used.

Figure 5A:
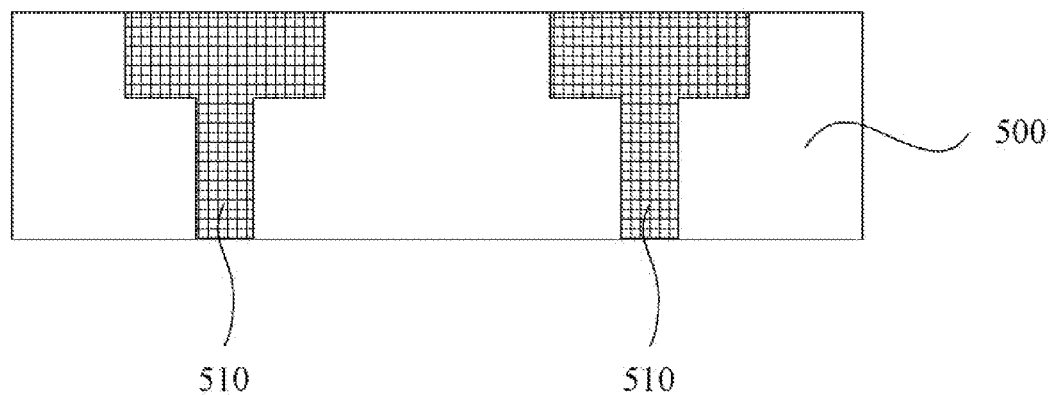
FIGS. 5A-5F illustrate manufacturing stages of another exemplary metal film resistor structure consistent with the disclosed embodiments.

FIGS. 5A-5F illustrate manufacturing stages of another exemplary metal film resistor structure 50. As shown in FIG. 5A, insulation layer 500 is provided and copper interconnect 510 may be formed in the insulation layer 500. The insulation layer 500 may include any appropriate material, such as SiO2, FSG, or other low K-dielectric material.

Figure 5B:
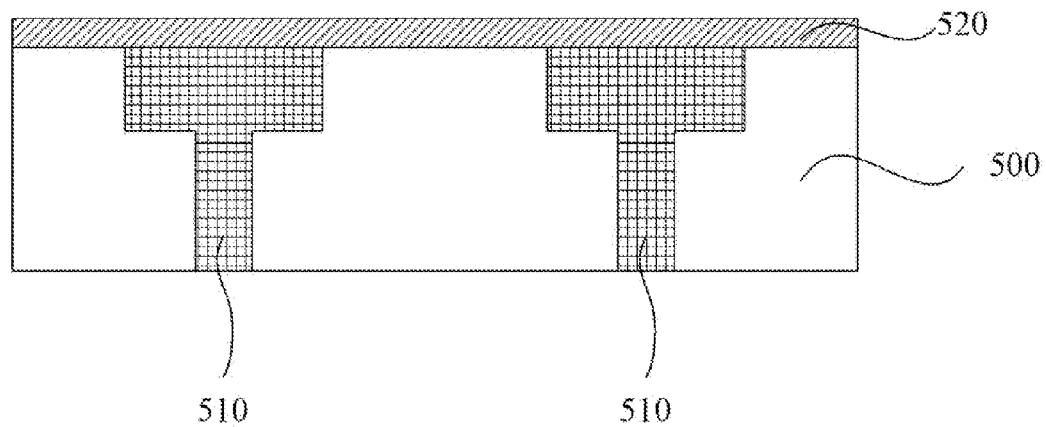

As shown in FIG. 5B, a cap layer 520 is formed on top of insulation layer 500 and lower copper interconnect 510. In certain embodiments, the cap layer 520 may be a diffusion barrier layer which is used to block the copper diffusion of the lower copper interconnect 510. The cap layer 520 may include any appropriate material, such as silicon nitride or silicon carbide, and may have a thickness of approximately 150 angstroms to 700 angstroms.

Figure 5C:
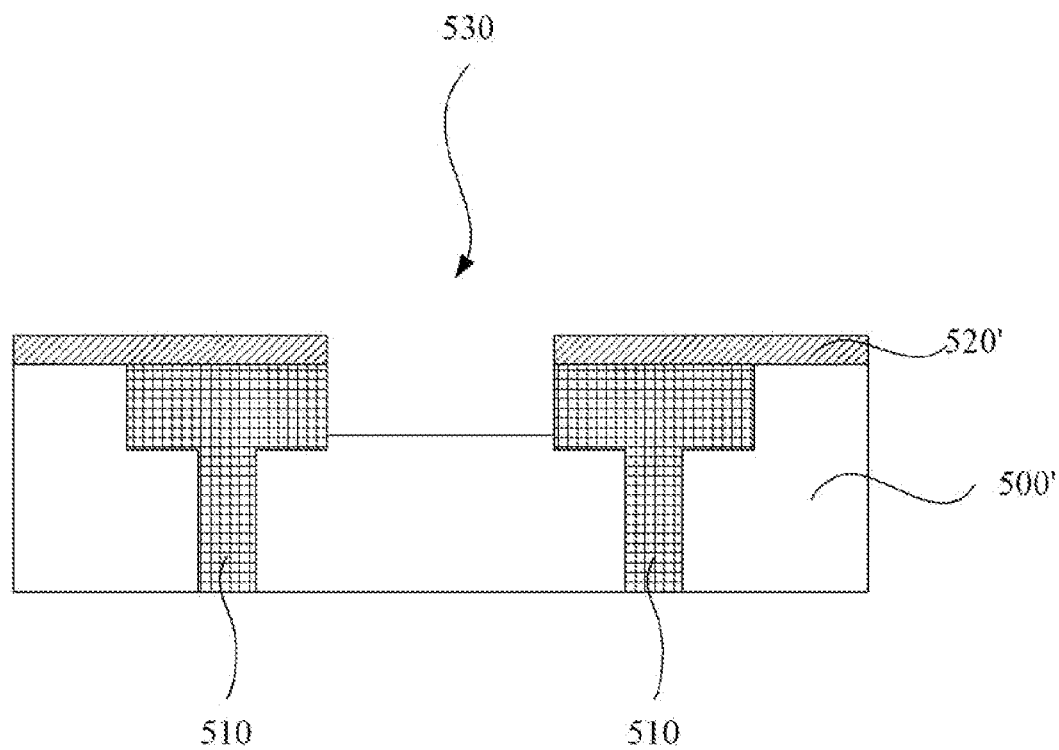

Further, as shown in FIG. 5C, using a photolithography process, a window 530 is formed by etching the cap layer 520 and insulation layer 500 using a photolithography mask. The window 530 may expose part of the lower copper interconnect 510 (e.g., side surfaces) and part of the insulation layer 500 inside window 530.

More particularly, the photolithography process may be performed on the cap layer 520 and insulation layer 500 using the photolithography mask, and the cap layer 520 and insulation layer 500 are then etched using a dry etching process or a wet etching process to remove certain parts of cap layer 520 and insulation layer 500 to form window 530, i.e., the space formed by the remaining cap layer 520, exposed lower copper interconnect 510 (part of the side surfaces of copper interconnect 510), and part of insulation layer 500. The window 530 may thus expose certain portion of side surfaces of lower copper interconnect 510 and portion of insulation layer 500 surrounded by or between the exposed portion of the lower copper interconnect 510. Further, the height of the window 530 is the thickness of the cap layer 520 plus the etching depth of the insulation layer 500.

Figure 5D:
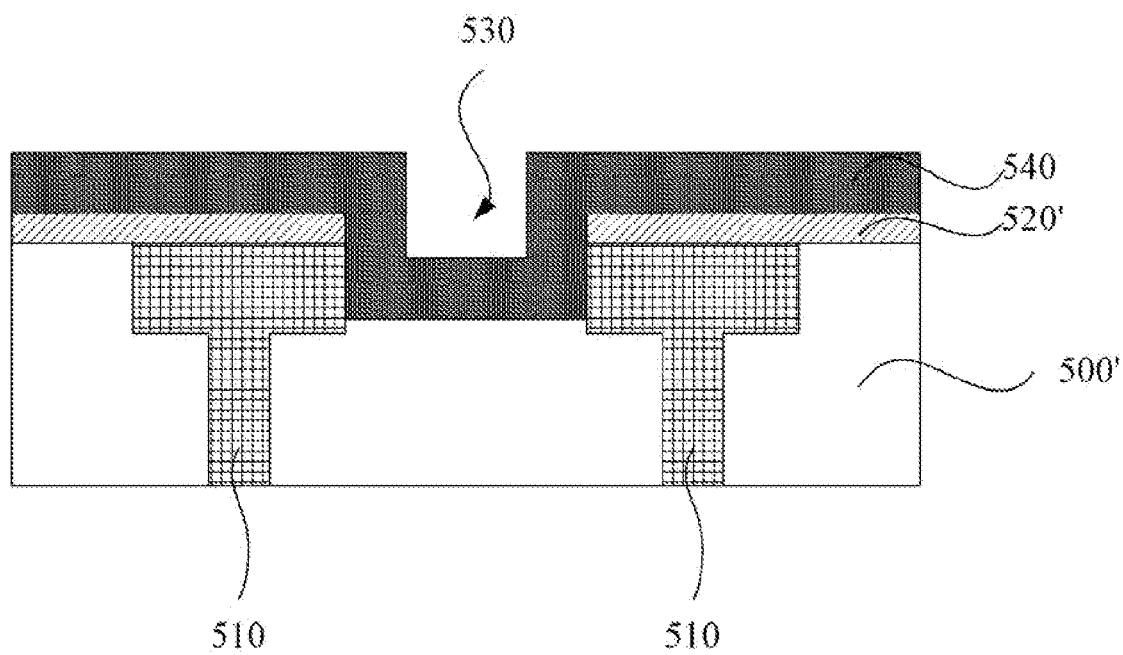

As shown in FIG. 5D, a metal film layer 540 is formed on top of the remaining cap layer 520 and inside the window 530. The metal film layer 540 may be formed using any appropriate deposition process, such as a physical vapor deposition process, a chemical vapor deposition process, or an atomic layer deposition process. The metal film layer 540 may have a thickness of approximately 50 angstroms to 2000 angstroms and may include one or more of W, WNx, Ti, TiNx, Ta and TaNx. Other materials may also be included. The thickness of metal film layer 540 may be less than the height of the window 530. In certain embodiments, the height of the window 530 (i.e., the thickness of the cap layer 520 plus the etching depth of the insulation layer 500) may be at least 100 angstroms more than the thickness of the metal film layer 540.

Figure 5E:
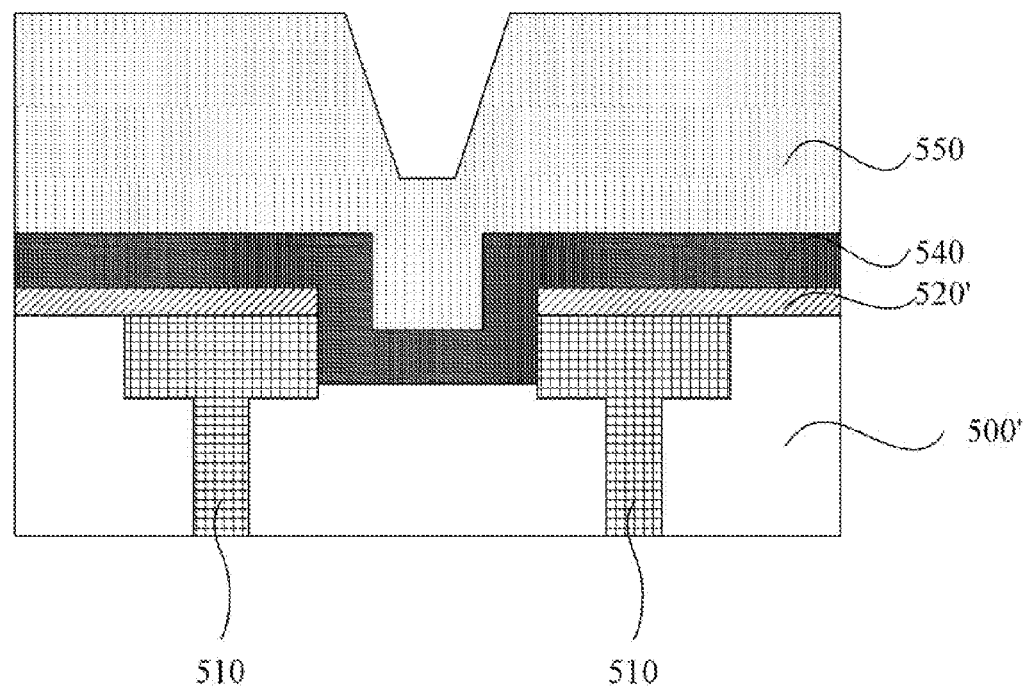

As shown in FIG. 5E, after forming the metal film layer 540, optionally or additionally, a protection layer 550 is formed on the metal film layer 540. The protection layer 550 may include any appropriate material such as SiO2, FSG, and other low K-dielectric material, and may have a thickness of approximately 1000 angstroms to 2000 angstroms. The protection layer 550 may be used to protect subsequent metal film resistor through the follow-up chemical mechanical polishing (CMP) process.

Figure 5F:
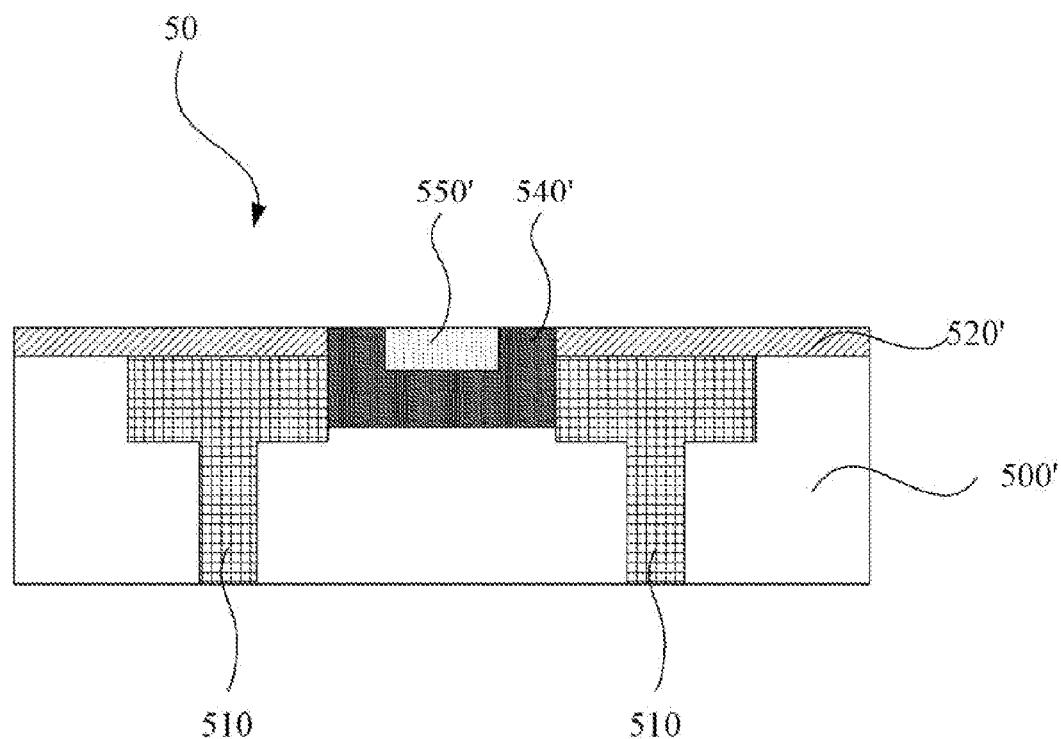

Further, as shown in FIG. 5F, a CMP process is performed on the protection layer 550 and metal film layer 540 to form metal film resistor 540'. The metal film resistor 540' is connected with the lower copper interconnect 510 at the side surface of the lower copper interconnect 510 exposed by the window 530. Further, because the CMP process stops at the surface of the cap layer 520, and the height of the window 530 is at least 100 angstroms more than the thickness of the metal film layer 540, portion of the protection layer 550 within window 530 may remain to protect metal film resistors 540' during the chemical mechanical polishing process. The process reliability of the metal film resistor 540' may be substantially improved.

Therefore, metal film resistor structure 50 is formed, including insulation layer 500, cap layer 520, metal film layer 540, and protection layer 550. The insulation layer 500 contains lower copper interconnect 510. The cap layer 520 also includes window 530 exposing part of side-surfaces of the copper interconnect 510 and part of insulation layer 500, such that the metal film layer 540 formed inside the window 530 can be electrically connected with the lower copper interconnect 510 at the exposed side-surfaces of the copper interconnect 510. Further, metal film resistor 540' is formed within window 530 by a CMP process. Thus, finally-formed metal film resistor 540' may be integrated or connected by lower copper interconnect 510 through a photolithography process using a single photolithography mask.

Figure 6A:
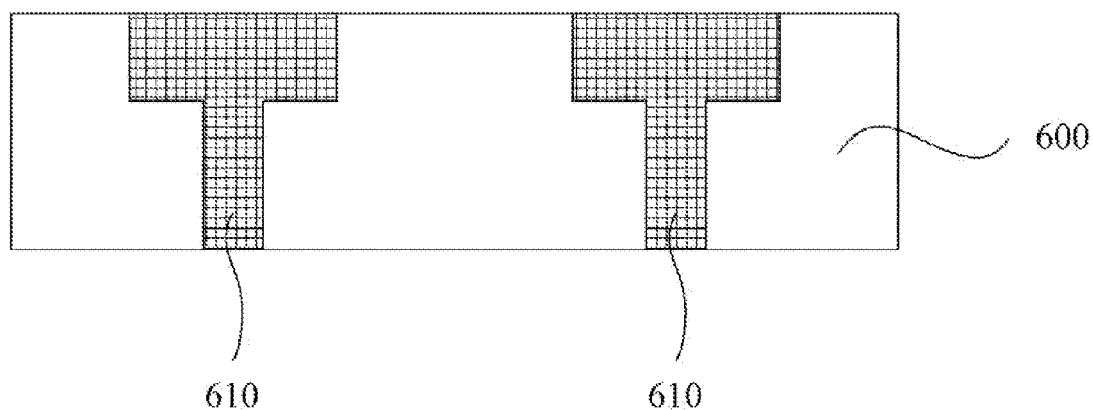
FIGS. 6A-6C illustrate manufacturing stages of another exemplary metal film resistor structure consistent with the disclosed embodiments.
Figure 6B:
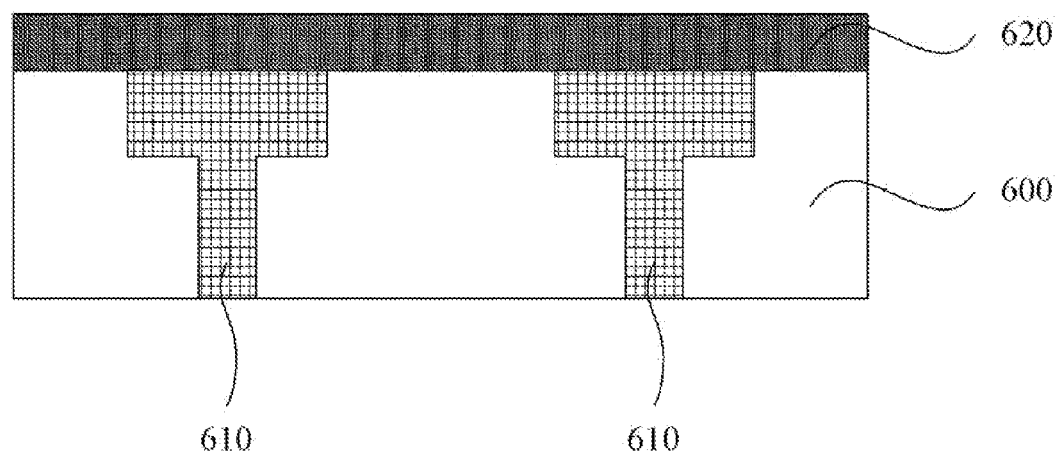
Figure 6C:
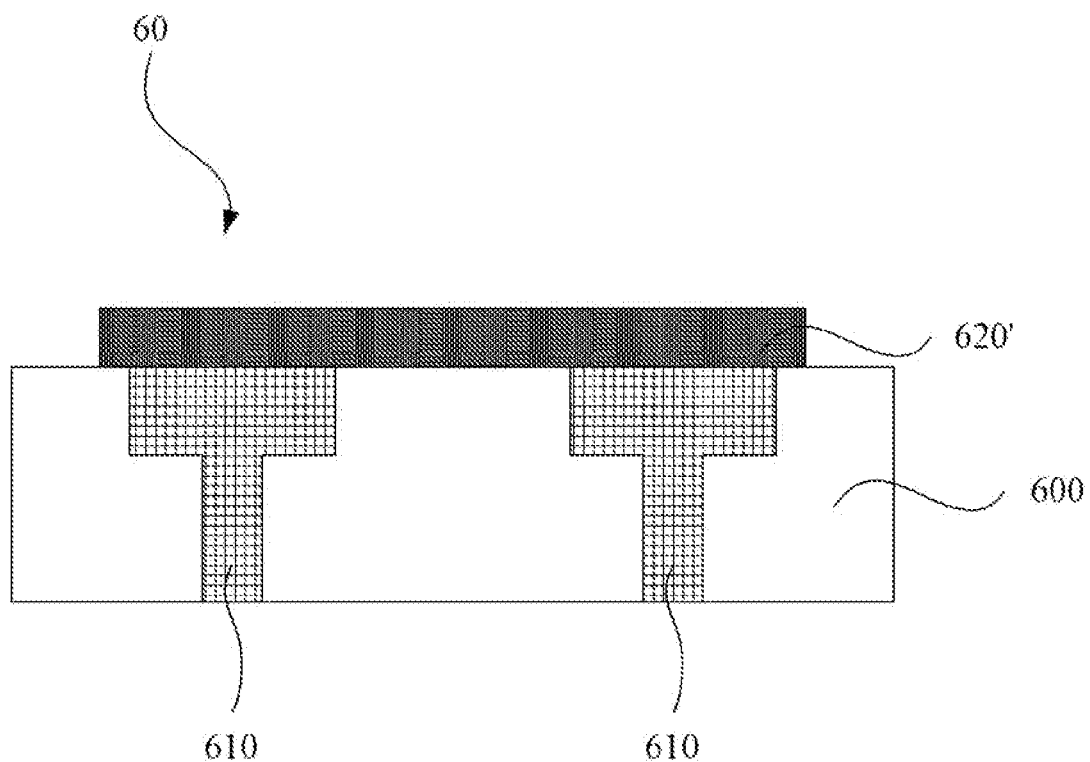

FIGS. 6A-6C illustrates manufacturing stages of another exemplary metal film resistor structure 60. As shown in FIG. 6A, insulation layer 600 is provided in metal film resistor structure 60, and lower copper interconnect 610 may be formed in the insulation layer 600 with portions of the lower copper interconnect 610 exposed at the top surface of the insulation layer 600. The insulation layer 600 may include any appropriate material, such as SiO2, FSG, or other low K-dielectric material.

As shown in FIG. 6B, a metal film layer 620 is formed on the insulation layer 600 and the lower copper interconnect 610. The metal film layer 620 may be formed using any appropriate deposition process, such as a physical vapor deposition process, a chemical vapor deposition process, or an atomic layer deposition process. The metal film layer 620 may have a thickness of approximately 50 angstroms to 2000 angstroms and may include one or more of W, WNx, Ti, TiNx, Ta and TaNx. Other materials may also be included.

As shown in FIG. 6C, a photolithography process may be performed on the metal film layer 620 using a photolithography mask (not shown), and the metal film layer 620 is etched based on the photolithography mask to form metal film resistor 620'. The photolithography mask is configured such that the metal film resistor 620' formed based on the metal film layer 620 covers entire exposed portions of the lower copper interconnect 610.

Because the metal film resistor 620' is formed by photolithography and by etching the metal film layer 620, the metal film resistor 620' also includes one or more of W, WNx, Ti, TiNx, Ta, and TaNx. In addition, the metal film resistor 620' is connected with lower copper interconnect 610 before entering subsequent or back-end manufacturing processes. Thus, in subsequent formation of upper copper interconnect, the metal film resistor 620' does not need to be over-etched to be connected with the upper copper interconnect, which prevents the metal film resistor 620' from being damaged and improves the process reliability of the metal film resistor 620'.

Figure 7:
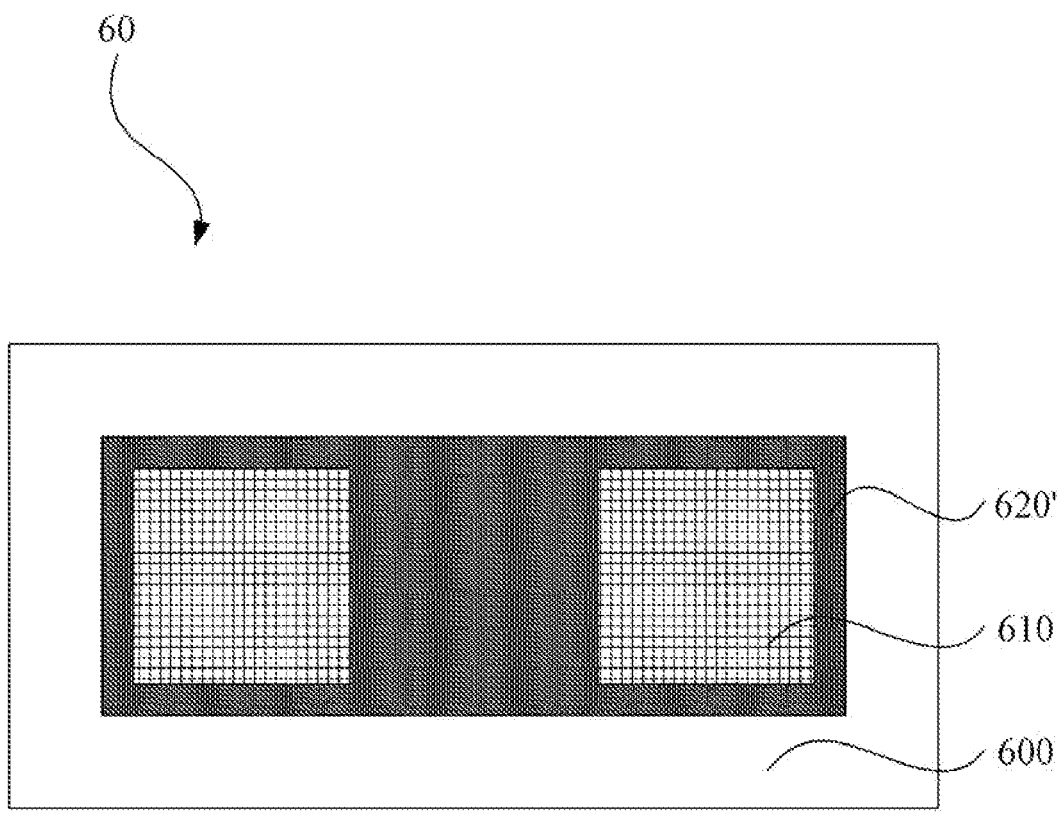
FIG. 7 illustrates a top view of a metal film resistor structure consistent with the disclosed embodiments.

FIG. 7 illustrates a top view of metal film resistor structure 60. As shown in FIG. 7, although the top surfaces of lower copper interconnect 610 are covered by metal film resistor 620', the top surfaces of lower copper interconnect 610 are shown for illustrative purposes. The top surfaces of lower copper interconnect 610 may be in the shape of a square or rectangle, and the metal film resistor 620' is rectangular shaped and covers entire lower copper interconnect 610. That is, metal film resistor 620' may cover the entire exposed portion (i.e., the top surfaces) of the lower copper interconnect 610. Other shapes and configurations can also be used. Here the lower copper interconnect 610 may be entirely covered by the metal film resistor 620' to prevent a large area of the lower copper interconnect 610 being exposed while etching the metal thin film 620, which may cause damage to the lower copper interconnect 610 and/or to the etching chamber.

Thus, metal film resistor structure 60 is formed, including insulation layer 600 and metal film layer 620. The insulation layer 600 contains lower copper interconnect 610. The metal film resistor 620' is formed based on the metal film layer 620 using a single photolithography mask, which is configured in a way such that the metal film resistor 620' is on the top of insulation layer 600 and covers the exposed portion of the lower copper interconnect 610. Alternatively or additionally, an additional layer may be formed on top of the insulation layer 600 and lower copper interconnect 610 that are not covered by metal film resistor 620'.

By using the disclosed metal film resistor structures and manufacturing methods, a metal film resistor structure may be created by using or adding a single photolithography mask and the metal film resistor in the metal film resistor structure can be connected with lower copper interconnect. The issues of the conventional techniques, such as etching damages to the metal film resistor when forming upper copper interconnect to connect the metal film resistor, can be solved and the reliability of the metal film resistor can be substantially increased.

This disclosure only explains certain embodiments of the present invention, and does not in any way limit the scope of the present invention. Those of ordinary skill in the art can make changes and modifications without departing from the principles and spirits of the present invention.

The invention claimed is:

1. A method for manufacturing a metal film resistor structure on a semiconductor device, comprising:
  providing an insulation layer on the semiconductor device, wherein a lower copper interconnect is formed in the insulation layer;
  forming a cap layer on the insulation layer and the lower copper interconnect;
  etching the cap layer based on a single photolithography mask to form a window exposing a portion of top surfaces or a portion of side surfaces of the lower copper interconnect and a portion of the insulation layer;
  forming a metal film layer on the cap layer and inside the window such that an exposed portion of the lower copper interconnect is connected with a part of the metal film layer within the window; and
  performing a chemical mechanical polishing (CMP) process to form a metal film resistor based on the metal film layer, wherein the metal film resistor is formed inside the window continuously with a shape which is the same as the window, having a horizontal portion and vertical portions extending from the horizontal portion to the top surface of the cap layer so that the horizontal portion of the metal film resistor is connected with the portion of the top surfaces of the lower copper interconnect or the vertical portions of the metal film resistor are connected with the portion of the side surfaces of the lower copper interconnect by using the single photolithography mask.

2. The method according to claim 1, further including: forming a protection layer on the metal film layer.

3. The method according to claim 2, wherein performing the CMP process further includes: performing the CMP process on the protection layer and the metal film layer.

4. The method according to claim 1, wherein: a height of the window is greater than a thickness of the metal film layer.

5. The method according to claim 1, wherein: the cap layer includes a diffusion barrier layer and a reinforcement layer.

6. The method according to claim 5, wherein: the diffusion barrier layer is formed by silicon nitride or silicon carbide, and has a thickness of approximately 150 angstroms to 700 angstroms.

7. The method according to claim 5, wherein: the reinforcement layer is formed by a low K-dielectric material and has a thickness of approximately 100 angstroms to 2000 angstroms.

8. The method according to claim 1, wherein: the metal film layer is formed by one or more of W, WNX, Ti, TiNx, Ta and TaNx.

9. The method according to claim 5, wherein:
  the window is formed in such a way that a height of the window is a thickness of the diffusion layer plus a thickness of the reinforcement layer;

the portion of the lower copper interconnect exposed by the window is at least portion of top surfaces of the lower copper interconnect; and the metal film resistor is connected with the lower copper interconnect at the top surfaces of the lower copper interconnect.

10. The method according to claim 1, wherein etching the cap layer further includes: etching the cap layer and etching the insulation layer to a predetermined etching depth to form the window, wherein:

a height of the window is a thickness of the cap layer plus the predetermined etching depth;

the portion of the lower copper interconnect exposed by the window is at least portion of side surfaces of the lower copper interconnect; and the metal film resistor is connected with the lower copper interconnect at the side surfaces of the lower copper interconnect.

11. The method according to claim 10, wherein: the cap layer is a diffusion barrier layer.

\* \* \* \* \*